(12) United States Patent
Özmen et al.

(10) Patent No.: US 11,025,015 B2
(45) Date of Patent: Jun. 1, 2021

(54) ELECTRICAL SOCKET APPARATUS, ELECTRICAL PLUG APPARATUS AND METHOD OF OPERATION

(71) Applicant: Vestel Elektronik Sanayi ve Ticaret A.Ş., Manisa (TR)

(72) Inventors: Ferhat Özmen, Manisa (TR); Onur Akdemir, Manisa (TR)

(73) Assignee: Vestel Elektronik Sanayi ve Ticaret A.S., Manisa (TR)

(*) Notice: Subject to any disclaimer, the term of this patent is extended or adjusted under 35 U.S.C. 154(b) by 0 days.

(21) Appl. No.: 16/257,802

(22) Filed: Jan. 25, 2019

(65) Prior Publication Data

US 2019/0237914 A1    Aug. 1, 2019

(30) Foreign Application Priority Data

Jan. 26, 2018  (EP) .................................. 18153762

(51) Int. Cl.

| | |
|---|---|
| H01R 4/50 | (2006.01) |
| H01R 13/66 | (2006.01) |
| H01R 13/717 | (2006.01) |
| H01R 13/447 | (2006.01) |
| H01R 24/76 | (2011.01) |
| H01R 24/30 | (2011.01) |
| H01R 25/00 | (2006.01) |
| H03K 17/945 | (2006.01) |
| H01R 103/00 | (2006.01) |

(52) U.S. Cl.
CPC ....... *H01R 13/6683* (2013.01); *H01R 13/447* (2013.01); *H01R 13/717* (2013.01); *H01R 24/30* (2013.01); *H01R 24/76* (2013.01); *H01R 25/006* (2013.01); *H03K 17/945* (2013.01); *H01R 2103/00* (2013.01); *H03K 2217/94106* (2013.01)

(58) Field of Classification Search
CPC .. H01R 13/6683; H01R 24/30; H01R 25/006; H01R 13/717; H01R 2103/00; H01R 13/447; H01R 24/76; H03K 17/945; H03K 2217/94106
USPC ..................................................... 439/620.21
See application file for complete search history.

(56) References Cited

U.S. PATENT DOCUMENTS

| | | | |
|---|---|---|---|
| 7,621,764 | B2 | 11/2009 | Shunjie |
| 9,425,533 | B2 | 8/2016 | Oosterman et al. |

(Continued)

FOREIGN PATENT DOCUMENTS

| | | |
|---|---|---|
| CN | 202917765 | 5/2013 |
| EP | 3076493 | 10/2016 |

(Continued)

*Primary Examiner* — Abdullah A Riyami
*Assistant Examiner* — Nelson R. Burgos-Guntin
(74) *Attorney, Agent, or Firm* — Brandon V. Zuniga; James R. Gourley; Carstens & Cahoon, LLP

(57) ABSTRACT

There is provided an electrical socket apparatus 200 comprising a slot 210 for receiving a pin 310 of a corresponding electrical plug 300. The apparatus 200 comprises a light sensor 212 arranged relative to the slot 210 and configured to receive light emitted by a light source 312 of a said electrical plug 300. The slot 210 is movable to a position in which the slot 210 is aligned with the pin 310 of a said electrical plug 300 on the basis of light emitted by a light source 312 of a said electrical plug 300 and received by the light sensor 212.

15 Claims, 4 Drawing Sheets

(56) References Cited

U.S. PATENT DOCUMENTS

| | | | |
|---|---|---|---|
| 10,211,586 B2* | 2/2019 | Adams | H01R 39/24 |
| 10,265,120 B2* | 4/2019 | Yates | A61B 17/285 |
| 2006/0164230 A1* | 7/2006 | DeWind | B60K 35/00 |
| | | | 340/461 |
| 2009/0203269 A1* | 8/2009 | Jenne | G01D 11/245 |
| | | | 439/862 |
| 2014/0022390 A1* | 1/2014 | Blank | B60R 1/12 |
| | | | 348/148 |
| 2014/0276949 A1* | 9/2014 | Staunton | F16J 15/3256 |
| | | | 606/130 |
| 2014/0349497 A1* | 11/2014 | Brown | E06B 3/6722 |
| | | | 439/110 |
| 2016/0003270 A1* | 1/2016 | Franklin | F16B 1/00 |
| | | | 439/529 |
| 2017/0165751 A1* | 6/2017 | Buller | B23K 26/144 |
| 2019/0201026 A1* | 7/2019 | Shelton, IV | A61B 5/065 |
| 2019/0237914 A1* | 8/2019 | Ozmen | H01R 13/447 |

FOREIGN PATENT DOCUMENTS

| | | |
|---|---|---|
| KR | 20170027950 | 3/2017 |
| WO | 2008047161 A2 | 4/2008 |

\* cited by examiner

ELECTRICAL SOCKET APPARATUS, ELECTRICAL PLUG APPARATUS AND METHOD OF OPERATION

CROSS-REFERENCE TO RELATED APPLICATIONS

This application claims the benefit under 35 U.S.C. § 119(a) and 37 CFR § 1.55 to European patent application 18153762.2 filed Jan. 26, 2018, the entire content of which is incorporated herein by reference.

TECHNICAL FIELD

The present disclosure relates to an electrical socket for receiving an electrical plug, an electrical plug and a method of operating an electrical socket apparatus.

BACKGROUND

Electrical sockets allow electrical equipment to be connected, via an electrical plug, to a primary, or mains, power supply. Typically, electrical sockets comprise slots arranged to receive pins of a corresponding plug. The configuration of the slots (i.e. their shape, number and positioning with respect to one another) varies across standards used by different countries. The slots provide access to electrical contacts which are connected to a mains power supply. The term "slot" is used herein by convention to mean the hole in the socket which receives a pin on the plug. The "slot" may be an elongate aperture or a circular aperture or some other shape that matches the shape of the pin that the slot is intended to receive.

When the pins of a corresponding electrical plug are inserted into the slots of the electrical outlet, the pins of the plug make an electrical connection with the contacts. The plug is then able to supply power to an electronic device to which it is attached.

SUMMARY

According to a first aspect disclosed herein, there is provided an electrical socket apparatus comprising a slot for receiving a pin of a corresponding electrical plug and a light sensor arranged relative to the slot and configured to receive light emitted by a light source of a said electrical plug, wherein the slot is movable to a position in which the slot is aligned with the pin of a said electrical plug on the basis of light emitted by a light source of a said electrical plug and received by the light sensor.

The slot may be rotatable to the position in which slot is aligned with the pin of a said electrical plug.

The apparatus may comprise an actuator configured to move the slot to the position in which the slot is aligned with the pin of a said electrical plug.

The apparatus may comprise a proximity sensor arranged to sense proximity of an electrical plug to the apparatus and a controller in communication with the proximity sensor and configured to send control signals to the actuator to move the slot as necessary to align the slot with the pin of a said electrical plug in response to the proximity sensor detecting proximity of a said electrical plug.

The proximity sensor may be an inductive sensor.

The controller may be configured to send control signals to the actuator to stop moving the slot in response to determining that the slot is aligned with the pin on the basis of light emitted by a light source of a said electrical plug and received by the light sensor.

The light sensor may be positioned in the slot.

The apparatus may comprise a plurality of slots for receiving a respective pin of a corresponding electrical plug, each slot comprising a light sensor.

According to a second aspect disclosed herein there is provided an electrical plug apparatus comprising a pin for insertion into a slot of a corresponding electrical socket and a light source arranged relative to the pin, wherein the light source is arranged such that light emitted by the light source may be detected by a light sensor of the corresponding electrical socket when the pin is aligned with the slot.

The light source may comprise a laser.

The light source may be actuatable.

The light source may be located on the pin.

The apparatus may comprise a plurality of pins, each pin comprising a light source.

In a third aspect disclosed herein there is provided a method for operating an electrical socket having a slot for receiving a pin of a corresponding electrical plug and a light sensor arranged relative to the slot, the method comprising moving the slot to a position in which the slot is aligned with the pin of a said electrical plug on the basis of light emitted by a light source of a said electrical plug and received by the light sensor.

The method may comprise determining proximity of a said electrical plug to the electrical socket and in response, moving the slot as necessary to align the slot with the pin of a said electrical plug.

The socket may comprise a socket according to the first aspect disclosed herein. The plug may comprise a plug according to the second aspect disclosed herein.

BRIEF DESCRIPTION OF THE DRAWINGS

To assist understanding of the present disclosure and to show how embodiments may be put into effect, reference is made by way of example to the accompanying drawings in which.

DETAILED DESCRIPTION

Figure 1:
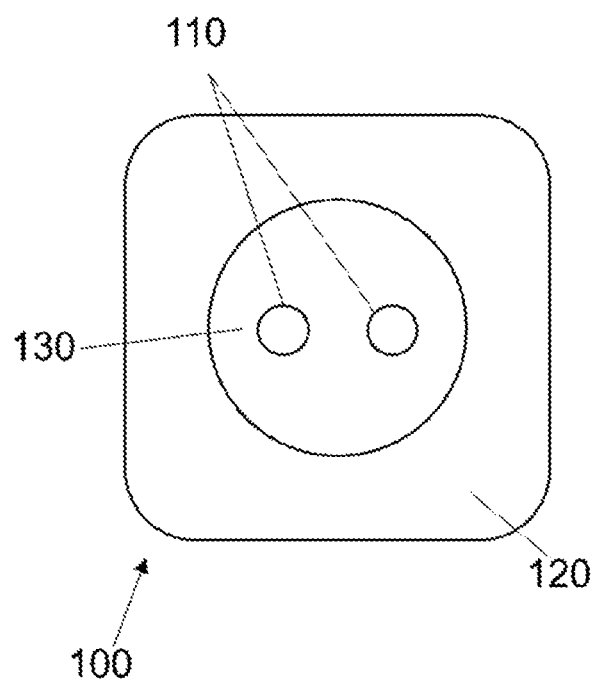
FIG. 1 shows schematically a front view of an example of a known electrical socket.

FIG. 1 shows a schematic front view of an example of a known electrical socket 100. The electrical socket 100 includes a cover plate 120 having slots 110 arranged therein to receive the pins of a corresponding electrical plug (not shown). The cover plate 120 of the electrical socket 100 comprises a recessed portion 130 for receiving the body of a corresponding electrical plug. The electrical socket 100 shown in FIG. 1 comprises two circular slots 110 arranged in a line for receiving the pins of a corresponding electrical plug.

The slots 110 such as those shown in FIG. 1 provide access to electrical contacts which are connected to the mains power supply. When a corresponding electrical plug is inserted into the electrical socket 100, the pins of the plug make an electrical connection with the contacts. The plug is then able to supply power to an electronic device to which it is attached.

Although one example of a known electrical socket 100 is shown in FIG. 1, many other electrical sockets are in common use. The slot arrangements on electrical outlets may comprise circular, rectangular or otherwise shaped slots. The slots may be arranged perpendicular, parallel or at an angle to one other. The slots may be arranged in a straight vertical or horizontal line relative to the cover plate, in rows on the cover plate or otherwise. Cover plates 120 of a socket outlet may comprise a recessed portion 130 for receiving the body of a plug as shown in FIG. 1, or may be substantially flat. The cover plate 120 of an electrical outlet may comprise plastic, metal or any other suitable material.

Electrical sockets 100 such as that shown in FIG. 1 have a fixed mounting. A corresponding plug can only be inserted when its pins are aligned with the slots 110 of the electrical socket 100 and so the plug can only be inserted when it approaches the electrical socket 100 at the correct orientation. In the standard to which the electrical socket 100 of FIG. 1 conforms, a plug may be turned 180° and be inserted into the socket 100; however the pins of the plug remain in the horizontal position relative to the socket 100. In many standards, there is no symmetry in the slot arrangement and so the plug can only be inserted from one angle.

If an electrical socket is mounted close to the floor, the cable connected to the plug may be forced against the floor when the plug is inserted. The resulting bend in the cable may cause a crack in the cable, causing failure of the device and a risk of arc or fire. In addition, if an electrical socket is positioned behind an object or piece of furniture it may be impractical to insert a plug into the socket, depending on the shape and size of the body of the plug.

Figure 2:
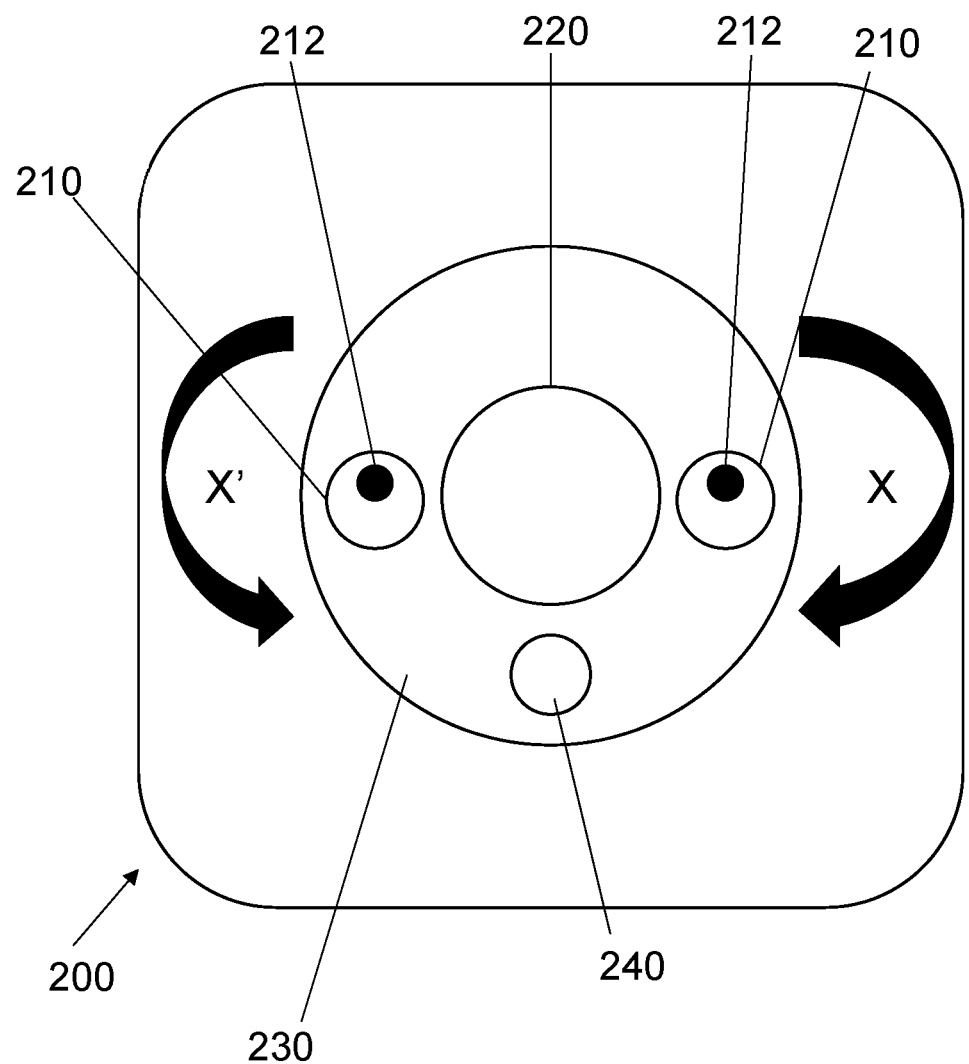
FIG. 2 shows schematically a cross section of an electrical socket apparatus according to an example.

FIG. 2 shows a cross-section of an electrical socket 200 according to an example disclosed herein. The electrical socket 200 comprises two slots 210 for receiving pins of a corresponding plug. The slots 210 each have light sensors 212 arranged therein in this example.

The slots and light sensors 212 are rotatable in a clockwise direction X and an anticlockwise direction X' by an actuator 220, in this example a motor. In the example shown in FIG. 2, the slots 210 and light sensors 212 are arranged on a surface 230 which is rotatable relative to the main body of the socket 200 by the actuator 220.

The electrical socket 200 described with reference to FIG. 2 may include a controller (not shown). The controller may comprise at least one processor.

The light sensors 212 are configured to detect light emitted by a light source 312 emitted from a corresponding plug 300, as described below with reference to FIG. 3. In use the slots 210 are movable to a position in which the slots 212 are aligned with the pins 310 on the basis of light emitted by a light source 312 of the electrical plug 300 and received by the light sensor 212.

Depending on the specific arrangement, alignment of the slots 210 and respective pins 310 may be recognised if any light is received by the respective light sensors 212. As another example, alignment of the slots 210 and respective pins 310 may be recognised if the light received by the respective light sensors 212 is a maximum.

The light sensors 212 may be located in the slots 210 or in some other known location relative to the slots 210. For example, the light sensors 212 may be located away from the slots 210 and the slots 210 are moved such that the light sensors 212 do not receive light emitted by light sources 312 on the plug 300, which indicates that the slots 210 are aligned with the respective pins 310.

Each slot 210 may be intended to receive a specific pin 310 on the plug 300, depending on for example the standard to which the plug and socket conform. For example, there may be positive, negative and ground (earth) pins on the plug and corresponding slots on the socket. In such a case, the light sources 312 on the plug 300 may emit light of different wavelengths or even encoded light such that the different light sources 312 and therefore the different pins 310 can be discriminated by the socket 200. The slots 210 can then be moved so as to align the correct slots 210 with the respective pins 310.

In this example the electrical socket 200 includes a proximity sensor 240 for determining the proximity of a plug 300 to the socket 200. The proximity sensor may, for example, be an inductive sensor.

Figure 3:
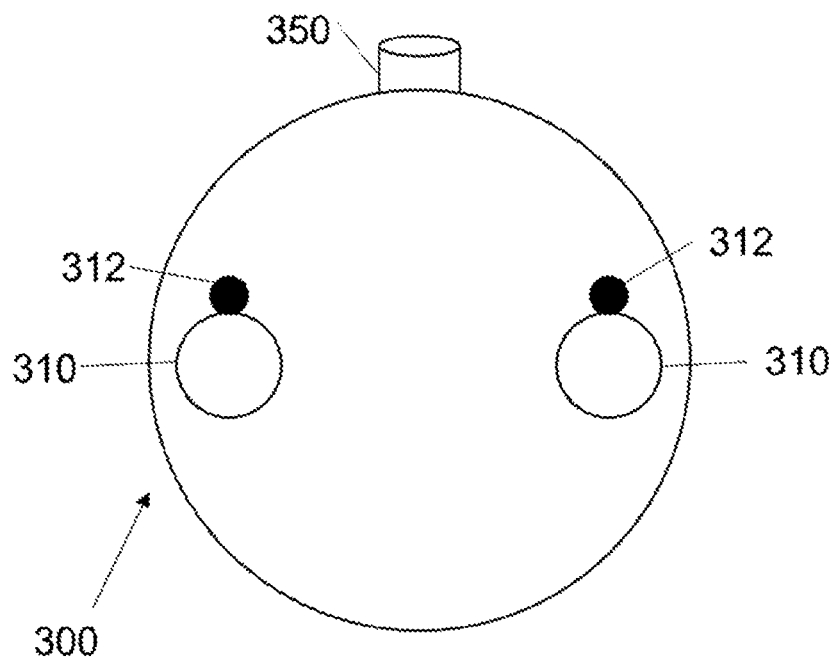
FIG. 3 shows schematically a front view of an electrical plug apparatus according to an example.

FIG. 3 shows a front view of an example of a plug 300 for use with the electrical socket 200 shown in FIG. 2. The plug 300 comprises pins 310 for insertion into the corresponding slots 210 of the electrical socket 200. The plug 300 comprises light sources 312 positioned in a known relation with respect to the pins 310. In this example, the light sources 312 are positioned closely adjacent to the respective pins 310. In one example, the light sources 312 may be laser pointers. The light sources 312 in this example are actuatable using a pushbutton 350. Other suitable mechanisms for actuating the light source 312 such as, for example, a switch may be used.

In use, the light sources 312 are actuated by the user, for example using pushbutton 350, as the plug 300 is brought into proximity to the socket 200. As the proximity sensor 240 of the socket 200 determines the presence of the plug 300, the actuator 240 begins to move the slots 310 and light sensors 312 as necessary to the position in which the light sensors 212 detect the light sources 312 such that each slot 212 is aligned with the respective pin 310.

Figure 4:
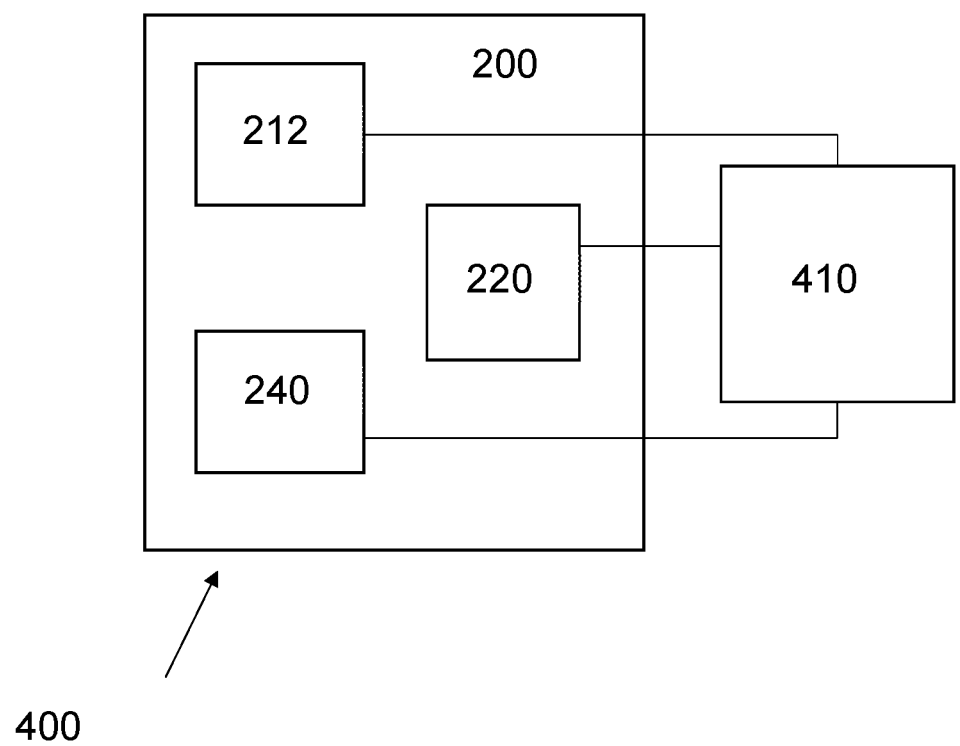
FIG. 4 shows schematically a block diagram of an electrical socket apparatus according to an example.

FIG. 4 shows a block diagram of a control system according to an example. The system includes an electrical socket 200 as described with reference to FIG. 2 including a proximity sensor 240, one or more light sensors 212 and an actuator 220. The proximity sensor 240, actuator 220 and light sensor 212 are in communication with a controller 410.

The controller 410 is configured to receive an indication from the proximity sensor when the proximity sensor determines the proximity of a plug to the socket 200.

The controller 410 is configured, in response to receiving an indication of the proximity of a plug, to provide control signals to the actuator 220 to cause movement of the slots 210 to a position in which the slots 210 are aligned with the pins of the plug on the basis of light emitted by a light source of the electrical plug and received by the light sensor 212. Causing movement of the slots 210 may comprise causing rotation of the rotatable surface 230 comprising the slots 210 and light sensors 212. That is, the slot arrangement of the electrical socket 200 begins to rotate as necessary as a user brings a plug towards the socket.

In response to receiving an indication from light sensors 212 that light has been detected from the light sources 312 of a plug 300, the controller is configured to send a control signal to the actuator to stop movement of the rotatable surface 230. As a result, once the light sources 312 of the plug 300 are aligned with the light sensors 212 at the socket 200, i.e. once the slots 210 have been rotated into a position in which they are aligned with the pins 310 of a plug 300, the actuator stops rotating the slots 210. The electrical socket 200 is then fixed at an angle as desired by the user.

Although the electrical socket according to the embodiment described above comprises two slots for receiving pins of a corresponding plug, the electrical socket may comprise a slot arrangement according to any standard as described with reference to FIG. 1. Each slot of a given slot arrangement may comprise a light sensor. Alternatively, the light sensor may be in a fixed position, relative to the slot arrangement, on the surface of the electrical socket (and the light source on the plug may be positioned in the same position relative to the corresponding pin arrangement).

Alternatively, or in addition, although the slot and light sensor have been described as rotatable, the slot and light sensor may be translatable within the mounting.

It will be understood that the processor or processing system or circuitry referred to herein may in practice be provided by a single chip or integrated circuit or plural chips or integrated circuits, optionally provided as a chipset, an application-specific integrated circuit (ASIC), field-programmable gate array (FPGA), digital signal processor (DSP), graphics processing units (GPUs), etc. The chip or chips may comprise circuitry (as well as possibly firmware) for embodying at least one or more of a data processor or processors, a digital signal processor or processors, baseband circuitry and radio frequency circuitry, which are configurable so as to operate in accordance with the exemplary embodiments. In this regard, the exemplary embodiments may be implemented at least in part by computer software stored in (non-transitory) memory and executable by the processor, or by hardware, or by a combination of tangibly stored software and hardware (and tangibly stored firmware).

Although at least some aspects of the embodiments described herein with reference to the drawings comprise computer processes performed in processing systems or processors, the invention also extends to computer programs, particularly computer programs on or in a carrier, adapted for putting the invention into practice. The program may be in the form of non-transitory source code, object code, a code intermediate source and object code such as in partially compiled form, or in any other non-transitory form suitable for use in the implementation of processes according to the invention. The carrier may be any entity or device capable of carrying the program. For example, the carrier may comprise a storage medium, such as a solid-state drive (SSD) or other semiconductor-based RAM; a ROM, for example a CD ROM or a semiconductor ROM; a magnetic recording medium, for example a floppy disk or hard disk; optical memory devices in general; etc.

The examples described herein are to be understood as illustrative examples of embodiments of the invention. Further embodiments and examples are envisaged. Any feature described in relation to any one example or embodiment may be used alone or in combination with other features. In addition, any feature described in relation to any one example or embodiment may also be used in combination with one or more features of any other of the examples or embodiments, or any combination of any other of the examples or embodiments. Furthermore, equivalents and modifications not described herein may also be employed within the scope of the invention, which is defined in the claims.

The invention claimed is:

1. An electrical socket apparatus comprising:
   a slot for receiving a pin of a corresponding electrical plug; and
   a light sensor arranged relative to the slot and configured to receive light emitted by a light source of the corresponding electrical plug;
   wherein the slot is movable to a position in which the slot is aligned with the pin of the corresponding electrical plug on the basis of light emitted by a light source of the corresponding electrical plug and received by the light sensor.

2. An apparatus according to claim 1, wherein the slot is rotatable to the position in which slot is aligned with the pin of the corresponding electrical plug.

3. An apparatus according to claim 1, comprising an actuator configured to move the slot to the position in which the slot is aligned with the pin of the corresponding electrical plug.

4. An apparatus according to claim 3, comprising:
   a proximity sensor arranged to sense proximity of the corresponding electrical plug to the apparatus; and
   a controller in communication with the proximity sensor and configured to send control signals to the actuator to move the slot as necessary to align the slot with the pin of the corresponding electrical plug in response to the proximity sensor detecting proximity of the corresponding electrical plug.

5. An apparatus according to claim 4, wherein the proximity sensor is an inductive sensor.

6. An apparatus according to claim 4, wherein the controller is configured to send control signals to the actuator to stop moving the slot in response to determining that the slot is aligned with the pin on the basis of light emitted by a light source of the corresponding electrical plug and received by the light sensor.

7. An apparatus according to claim 1 wherein the light sensor is positioned in the slot.

8. An apparatus according to claim 7, comprising a plurality of slots for receiving a respective pin of the corresponding electrical plug, each slot comprising a light sensor.

9. An electrical plug apparatus comprising:
   a pin for insertion into a slot of a corresponding electrical socket; and
   a light source arranged relative to the pin, wherein the light source is arranged such that light emitted by the light source may be detected by a light sensor of the corresponding electrical socket when the pin is aligned with the slot.

10. An apparatus according to claim 9, wherein the light source is a laser.

11. An apparatus according to claim 9, wherein the light source is actuatable.

12. An apparatus according to claim 9, wherein the light source is located on the pin.

13. An apparatus according to claim 12, comprising a plurality of pins, each pin comprising a light source.

14. A method for operating an electrical socket having a slot for receiving a pin of a corresponding electrical plug and a light sensor arranged relative to the slot, the method comprising:
    moving the slot to a position in which the slot is aligned with the pin of the corresponding electrical plug on the basis of light emitted by a light source of the corresponding electrical plug and received by the light sensor.

15. A method according to claim 14, comprising:
    determining proximity of the corresponding electrical plug to the electrical socket; and in response, moving the slot as necessary to align the slot with the pin of the corresponding electrical plug.

* * * * *